(12) United States Patent
Kang et al.

(10) Patent No.: US 11,362,419 B2
(45) Date of Patent: Jun. 14, 2022

(54) DEVICE FOR TESTING BEAM FORMING PROCESSOR

(71) Applicant: Samsung Electronics Co., Ltd., Suwon-si (KR)

(72) Inventors: Daehyun Kang, Suwon-si (KR); Byungjoon Park, Pohang-si (KR); Juho Son, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 180 days.

(21) Appl. No.: 16/644,736

(22) PCT Filed: Aug. 29, 2018

(86) PCT No.: PCT/KR2018/009975
§ 371 (c)(1),
(2) Date: Mar. 5, 2020

(87) PCT Pub. No.: WO2019/066272
PCT Pub. Date: Apr. 4, 2019

(65) Prior Publication Data
US 2020/0266536 A1    Aug. 20, 2020

(30) Foreign Application Priority Data

Sep. 27, 2017    (KR) .................. 10-2017-0125104

(51) Int. Cl.
*H04B 17/15*    (2015.01)
*H01Q 3/26*    (2006.01)
(Continued)

(52) U.S. Cl.
CPC ........... *H01Q 3/267* (2013.01); *H04B 7/0617* (2013.01); *H04B 17/11* (2015.01); *H04B 17/15* (2015.01)

(58) Field of Classification Search
CPC ........ H01Q 3/267; H04B 17/11; H04B 17/15; H04B 7/0617
See application file for complete search history.

(56) References Cited

U.S. PATENT DOCUMENTS

2006/0038579 A1    2/2006  Guthrie et al.
2011/0059706 A1*   3/2011  Harel .................. H01Q 3/00
                                                    455/115.1
(Continued)

FOREIGN PATENT DOCUMENTS

DE    10 2016 202 112 A1    8/2017
JP       2010-124360 A        6/2010

OTHER PUBLICATIONS

Adithya et al.; Experimental Evaluation of a Beamforming Array Calibration System; IEEE; Mar. 1, 2014; Bozeman, MT.
(Continued)

*Primary Examiner* — Janice N Tieu
(74) *Attorney, Agent, or Firm* — Jefferson IP Law, LLP (57) ABSTRACT

The present invention relates to a communication technique for merging, with IoT technology, a 5G communication system for supporting a data transmission rate higher than that of a 4G system, and a system therefor. In addition, the present invention provides a device for testing a beam forming processor, comprising: at least one power determination unit, which is electrically connected to the beam forming processor for performing beam forming, and determines the output power of the beam forming processor; and a control unit, which is connected to the power determination unit by wire and determines whether the beam forming processor is normal on the basis of the output power received from the power determination unit.

15 Claims, 8 Drawing Sheets

(51) Int. Cl.
*H04B 17/11* (2015.01)
*H04B 7/06* (2006.01)

(56) References Cited

U.S. PATENT DOCUMENTS

| | | |
|---|---|---|
| 2014/0307568 A1 | 10/2014 | Zhang et al. |
| 2015/0048980 A1 | 2/2015 | Chin |
| 2015/0168486 A1 | 6/2015 | Isaac et al. |
| 2016/0050569 A1 | 2/2016 | Olgaard et al. |
| 2016/0204881 A1 | 7/2016 | Chung et al. |
| 2016/0359507 A1* | 12/2016 | Gerdin ................ H04B 1/0475 |
| 2017/0201309 A1 | 7/2017 | Kang et al. |
| 2017/0222734 A1 | 8/2017 | Pauly |
| 2017/0288738 A1* | 10/2017 | Lee .................... H04W 52/283 |
| 2019/0041495 A1 | 2/2019 | Steinbuch et al. |
| 2019/0068296 A1* | 2/2019 | Rowell ............... H04B 17/101 |
| 2021/0099195 A1* | 4/2021 | Wigren ............... H04B 1/3838 |

OTHER PUBLICATIONS

European Search Report dated Aug. 3, 2020; European Appln. No 18860757.6—1205/3667816 PCT/KR2018009975.
Kottkamp et al.; Antenna Array Testing—Conducted and Over the Air: The Way to 5G; White Paper; Rohde & Schwarz; XP055429495; https://cdn.rohdeschwarz.com/pws/dl_downloads/dl_application/application_notes/1ma286/1MA286_2e_AntArrTest_5G.pdf; Mar. 20, 2017.
European Search Report dated Nov. 11, 2020; European Appln. No. 18860757.6—1205/3667816 PCT/KR2018009975.
Korean Office Action with English translation dated Jan. 5, 2021; Korean Application No. 10-2017-0125104.

* cited by examiner

DEVICE FOR TESTING BEAM FORMING PROCESSOR

TECHNICAL FIELD

The disclosure relates to a device for testing a beamforming processor, which can determine whether the beamforming processor that is used in a wireless system supporting beamforming performs a normal operation.

BACKGROUND ART

To meet the increasing demand for wireless data traffic since the deployment of 4G communication systems, efforts have been made to develop an improved 5G or pre-5G communication system. Therefore, the 5G or pre-5G communication system is also called a "beyond 4G network" communication system or a "post LTE System." Implementation of the 5G communication system in ultrahigh frequency (mmWave) bands, e.g., 60 GHz bands, is being considered in order to accomplish higher data rates. To mitigate a path loss of the radio waves and increase the transmission distance on the radio waves in the ultrahigh frequency bands, beamforming, massive multiple-input multiple-output (massive MIMO), full dimensional MIMO (FD-MIMO), array antenna, analog beamforming, and large scale antenna techniques are being discussed for 5G communication systems. In addition, in 5G communication systems, development for system network improvement is under way based on evolved small cells, advanced small cells, cloud radio access networks (cloud RANs), ultra-dense networks, device-to-device (D2D) communication, wireless backhaul, moving network, cooperative communication, coordinated multi-points (CoMP), reception-end interference cancellation, and the like. In addition, in the 5G system, hybrid FSK and QAM modulation (FQAM) and sliding window superposition coding (SWSC), as advanced coding modulation (ACM) systems, and filter bank multi carrier (FBMC), non-orthogonal multiple access (NOMA), and sparse code multiple access (SCMA), as advanced access technologies, have been developed.

On the other hand, the Internet, which is a human centered connectivity network where humans generate and consume information, is now evolving to the Internet of things (IoT) where distributed entities, such as things, exchange and process information without human intervention. The Internet of everything (IoE), which is a combination of IoT technology and big data processing technology through connection with a cloud server, has emerged. Technology elements, such as "sensing technology", "wired/wireless communication and network infrastructure", "service interface technology", and "security technology" have been demanded for IoT implementation; therefore, technologies, such as a sensor network, machine-to-machine (M2M) communication, machine type communication (MTC) for a connection between things, are recently researched. Such an IoT environment may provide intelligent Internet technology (IT) services that create a new value for human life by collecting and analyzing data generated among connected things. IoT may be applied to a variety of fields including smart home, smart building, smart city, smart car or connected car, smart grid, health care, smart appliances, and advanced medical services through convergence and combination between existing information technology (IT) and various industrial applications.

In line with this, various attempts have been made to apply 5G communication systems to IoT networks. For example, technologies such as a sensor network, machine-to-machine (M2M) communication, and machine type communication (MTC) may be implemented by beamforming, MIMO, and array antennas, which correspond to 5G communication technology. Application of a cloud radio access network (cloud RAN) as the above-described big data processing technology may also be considered to be an example of convergence between the 5G technology and the IoT technology.

DISCLOSURE OF INVENTION

Technical Problem

The disclosure provides a processor testing device capable of quickly and accurately testing whether a beamforming processor or a processor having a plurality of output ports, being used in 5G mobile communication, that is, in mobile communication using beamforming, performs a normal operation.

Solution to Problem

According to the disclosure, a device for testing a beamforming processor includes at least one power determination unit electrically connected to the beamforming processor performing beamforming and configured to determine an output power of the beamforming processor; and a controller connected by wire to the power determination unit and configured to determine whether the beamforming processor is normal based on the output power received from the power determination unit.

The power determination unit may include a phase compensation unit configured to compensate for a phase difference between a plurality of output ports deployed on the beamforming processor and an antenna connected to correspond to the plurality of output ports.

The power determination unit may be configured to determine the output power of the beamforming processor based on respective output powers outputted from a plurality of output ports deployed on the beamforming processor.

The controller may be configured to determine that the beamforming processor is normal if the output power is included in a predetermined error range.

The power determination unit may be configured to make the beamforming processor be seated on the power determination unit and to electrically connect the beamforming processor to the power determination unit.

The device for testing the beamforming processor may further include at least one beamforming processor electrically connected to the at least one power determination unit, wherein the beamforming processor may include a plurality of output ports and phase shifters built in the beamforming processor corresponding to the respective output ports.

According to the disclosure, if a plurality of power determination units are deployed in the device for testing the beamforming processor, wires connecting the respective power determination units to the controller may have the same length.

According to the disclosure, a device for testing a processor includes at least one power determination unit electrically connected to the processor including a plurality of output ports and configured to determine an output power of the processor based on powers outputted from the respective output ports; and a controller connected by wire to the power determination unit and configured to determine whether the processor is normal based on the output power of the processor received from the power determination unit.

The power determination unit may include a phase compensation unit configured to compensate for a phase difference between the respective output ports and an external device connected corresponding to the respective output ports.

The controller may be configured to determine that the processor is normal if the output power of the processor is included in a predetermined error range.

The power determination unit may further include a seat unit configured to make the processor be seated on the power determination unit and to electrically connect the processor to the power determination unit.

The device for testing the processor may further include at least one processor electrically connected to the at least one power determination unit, wherein the processor may include phase shifters built in the processor corresponding to the respective output ports.

According to the disclosure, if a plurality of power determination units are deployed in the device for testing the processor, wires connecting the respective power determination units to the controller may have the same length.

According to the disclosure, a device for testing a beamforming module includes the beamforming module on which a plurality of beamforming processors performing beamforming are deployed; an antenna module configured to perform wireless communication with the beamforming module; and a controller configured to determine whether the beamforming module is normal based on beam information of the beamforming module received from the antenna module.

Advantageous Effects of Invention

According to an embodiment, because it is possible to determine whether the processor is normal based on the output power of the processor directly received through the wire, accuracy of the processor test may be increased.

Further, according to an embodiment, because it is possible to determine whether the beamforming processor is normal primarily through the beamforming processor and the test device excluding the antenna during the beamforming processor test, the test method by wire can be advantageous in cost and time as compared with the wireless test method including the antenna.

MODE FOR THE INVENTION

In explaining embodiments, explanation of technical contents that are well known in the art to which the disclosure pertains and are not directly related to the disclosure will be omitted. This is to transfer the subject matter of the disclosure more clearly without obscuring the same through omission of unnecessary explanations.

For the same reason, in the accompanying drawings, sizes and relative sizes of some constituent elements may be exaggerated, omitted, or briefly illustrated. Further, sizes of the respective constituent elements do not completely reflect the actual sizes thereof. In the drawings, the same drawing reference numerals are used for the same or corresponding elements across various figures.

The aspects and features of the disclosure and methods for achieving the aspects and features will be apparent by referring to the embodiments to be described in detail with reference to the accompanying drawings. However, the disclosure is not limited to the embodiments disclosed hereinafter, and it can be implemented in diverse forms. The matters defined in the description, such as the detailed construction and elements, are only specific details provided to assist those of ordinary skill in the art in a comprehensive understanding of the disclosure, and the disclosure is only defined within the scope of the appended claims. In the entire description of the disclosure, the same drawing reference numerals are used for the same elements across various figures.

In this case, it will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

Also, each block of the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

In this case, the term "~unit", as used in an embodiment, means, but is not limited to, a software or hardware component, such as FPGA or ASIC, which performs certain tasks. However, "~unit" is not meant to be limited to software or hardware. The term "~unit" may advantageously be configured to reside on the addressable storage medium and configured to execute on one or more processors. Thus, "~unit" may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and "~units" may be combined into fewer components and "~units" or further separated into additional components and "~units". Further, the components and "~units" may be implemented to operate one or more CPUs in a device or a security multimedia card. Further, in an embodiment, the term "~unit" may include one or more processors.

As the operating frequency being used for mobile communication is increased, the internal loss of a processor that operates at the operating frequency may also be increased. As described above, in order to supplement this, radio waves are combined in the air through technology, such as beamforming, to minimize the above-described loss, and thus the output power of the processor can be improved.

In order to perform the above-described beamforming operation, the processor is combined with an antenna for radiating beams to an outside. Accordingly, a test for determining whether the processor combined with the antenna is normal may be wirelessly performed using the antenna.

Figure 1:
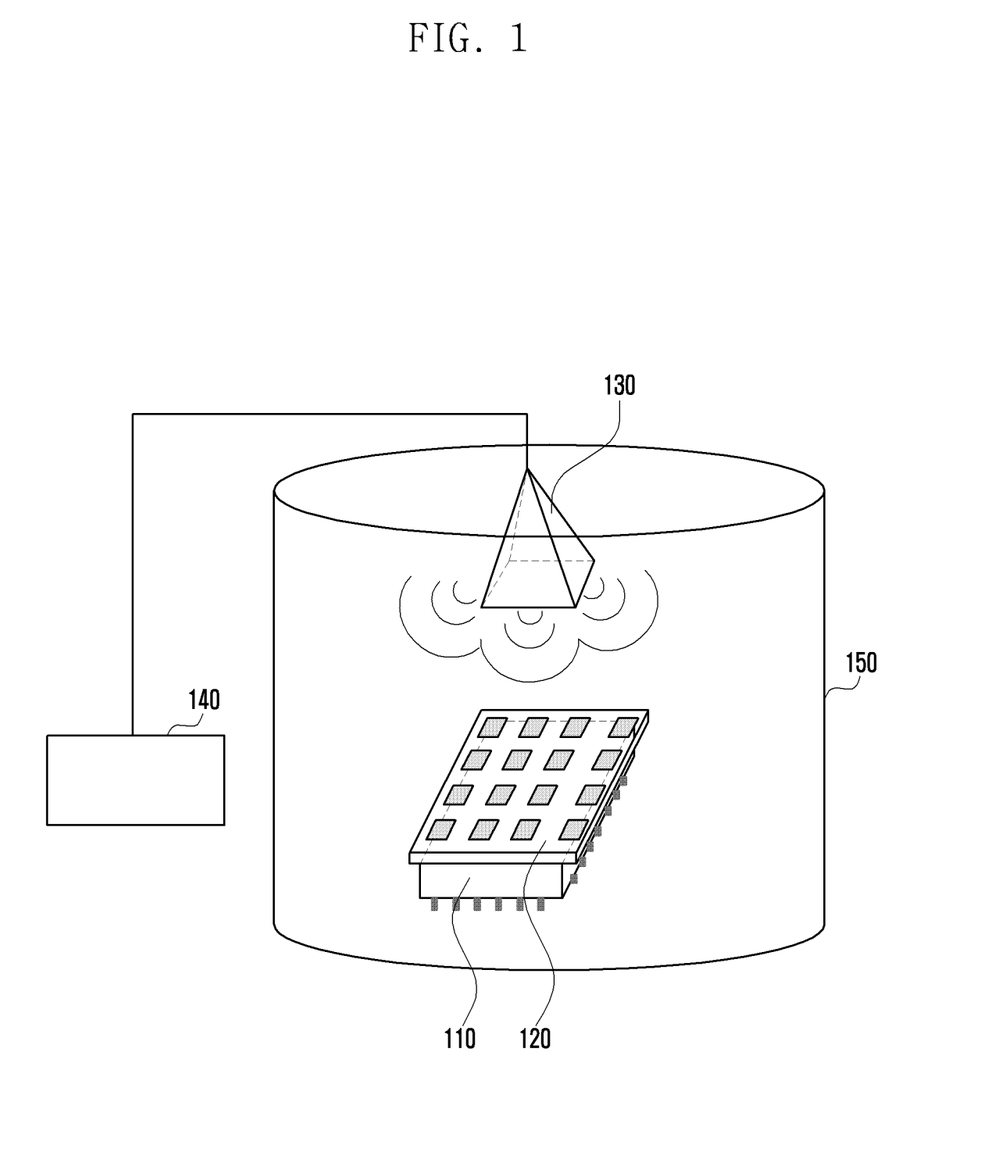
FIG. 1 is a diagram illustrating a case where a beamforming processor is wirelessly tested.

FIG. 1 is a diagram illustrating a case where a beamforming processor is wirelessly tested.

As described above, a beamforming processor 110 may include an antenna 120 for radiating beams under the control of the beamforming processor 110 (as illustrated in FIG. 1, the antenna 120 may include a plurality of antenna elements, and to be described later, the antenna elements may be respectively connected to output ports of the beamforming processor 110).

Although not illustrated in FIG. 1, the beamforming processor 110 may include a device providing an input power to the beamforming processor 110, and through the device, the beamforming processor 110 may form and radiate the beam to an outside through the antenna 120.

In this case, a test device antenna 130 constituting a test device may receive the beam being radiated through the antenna 120. Although FIG. 1 illustrates a case where the test device antenna 130 is composed of a horn antenna, this merely corresponds to an embodiment, and the test device antenna 130 may have various structures.

Beam information (that may include a beam intensity, a beam phase, or a beam index) received through the test device antenna 130 may be transferred to a test device controller 140, and the test device controller 140 may determine whether the beamforming processor performs a normal operation based on the received beam information.

For example, if a beam gain value determined based on the beam information received through the test device antenna 130 is 15 dB in a state where the beam gain value minimally required through the beamforming processor is 10 dB, it may be determined that the beamforming processor having radiated the beam is normal.

However, a method for testing the beamforming processor as illustrated in FIG. 1 may cause several problems to occur.

First, because the test is performed wirelessly, there may be a high probability that interference due to the surrounding environment exerts an influence on the test result, and thus accuracy of the test may be deteriorated. Second, even if a shielding device 150 is installed around the beamforming processor as illustrated in FIG. 1 in order to minimize the influence of the interference, the cost for performing the test may be increased, and the volume of the test device may be increased due to the shielding device 150. Third, because the test should be performed wirelessly and signals should be exchanged between the antenna 120 and the test device antenna 130, the time required for the test may be lengthened.

Accordingly, in order to solve the above-described problem, there is a need for a beamforming processor device to be described hereinafter.

Figure 2:
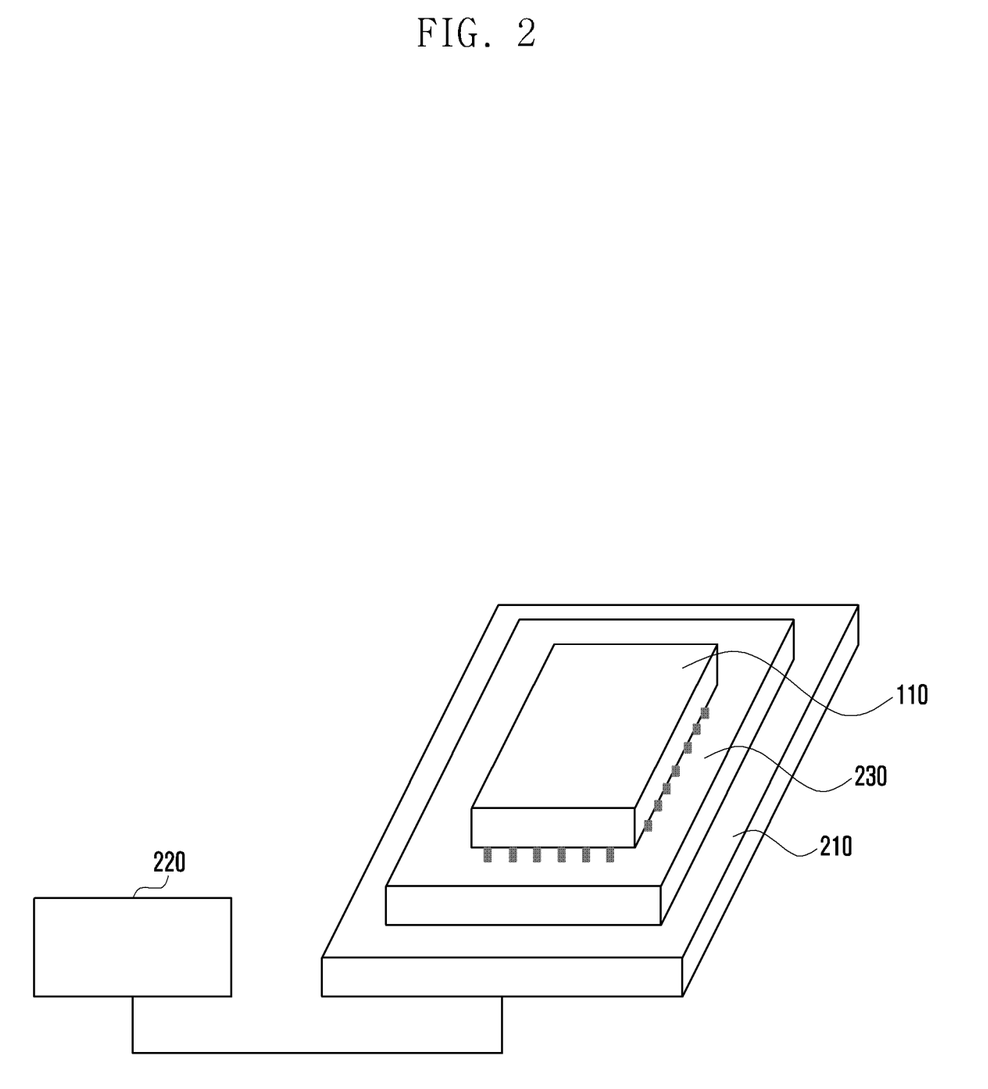
FIG. 2 is a diagram illustrating a case where a beamforming processor is tested by wire according to an embodiment of the disclosure.

FIG. 2 is a diagram illustrating a case where a beamforming processor is tested by wire according to an embodiment of the disclosure.

The problem of the method for testing the beamforming processor as described above with reference to FIG. 1 is that the test of the beamforming processor is wirelessly performed. Because the above-described problem is basically caused by the point that the test is performed in a state where the beamforming processor is combined with the antenna, it is intended that a test device according to the disclosure to be disclosed through FIG. 2 uses a beamforming processor from which an antenna is removed.

Specifically, as illustrated in FIG. 2, a device for testing a beamforming processor according to an embodiment of the disclosure may include the beamforming processor 110 performing beamforming; at least one power determination unit 210 electrically connected to the beamforming processor and configured to determine an output power of the beamforming processor 110; and a controller 220 connected by wire to the power determination unit and configured to determine whether the beamforming processor 110 is normal based on the output power of the beamforming processor 110 being received from the power determination unit 210.

Because the beamforming processor 110 is required to be combined with a plurality of antenna elements and to form beams at various angles, it may include a plurality of input ports or output ports. Further, the beamforming processor 110 may include phase shifters built therein corresponding to the input ports or the output ports (the details thereof will be described later with reference to FIGS. 4A and 4B).

Meanwhile, the power determination unit 210 may further include a seat unit 230 configured to make the beamforming processor 110 be seated thereon and to electrically connect the beamforming processor to the power determination unit 210.

Because the seat unit 230 should electrically connect the power determination unit 210 and the beamforming processor 110 to each other, it should include a conductor material. However, it may be preferable to configure the seat unit 230 with a material, such as plastic, from the viewpoint of cost and safety except for necessary portions for electrical connections.

Although FIG. 2 illustrates a case where the power determination unit 210 and the seat unit 230 are in the shape of layers, the scope of the disclosure should not be limited thereto. For example, the seat unit 230 may have a groove formed corresponding to the shape of the beamforming processor 110. Further, the seat unit 230 may be formed to surround the beamforming processor 110.

According to an embodiment of the disclosure, the controller 220 may determine whether the beamforming processor 110 is normal depending on whether the output power of the beamforming processor 110 that is determined by the power determination unit 210 to be transferred is included in a predetermined error range.

For example, if the output power of the beamforming processor 110 determined through the power determination unit 210 is 120 W and a predetermined error range is 110 W<output power<200 W, the controller 220 may determine that the beamforming processor 110 is normal.

In addition, the controller 200 may also be used for the purpose of other tests except for the test of whether the beamforming processor 110 is normal through the output power of the beamforming processor 110.

For example, the controller 200 according to the disclosure may be used to test an error vector magnitude (EVM). The EVM may be an index indicating a nonlinear magnitude and a phase error that an output signal has against a reference signal. That is, in the case of a linear device, it can output linear magnitude and phase signals against the reference signal, and thus the EVM value may be 0%. In contrast, in the case of a nonlinear device, it can output nonlinear magnitude and phase signals against the reference signal, and thus the EVM value may be 0% or more (the EVM test may be possible even by a spectrum analyzer).

Further, the controller 200 according to the disclosure may be used to test an adjacent channel leakage ratio (ACLR). The ACLR is a value that may be determined based on intermodulation distortion of a signal. More specifically, the ACLR may be determined by measuring the power in addition to the level of the signal transmitted or received through the beamforming processor (the ACLR test may be possible even by a spectrum analyzer).

Further, the controller according to the disclosure may also measure current consumption when a power supply device supplies the power to the beamforming processor, and it may perform a spur test (it is a test for measuring the signal level in addition to a desired signal, and it may be performed even through a spectrum analyzer).

Meanwhile, although not illustrated, in order to test the beamforming processor, a device to apply a power to the beamforming processor 110 is necessary, and a separate power input device may be included in the configuration of FIG. 2.

As another embodiment, the controller 220 may supply a predetermined input power to the power determination unit 210 through a separate control, and it may determine whether the beamforming processor 110 is normal based on the input power and the output power of the beamforming processor 110 determined through the power determination unit 210.

The important point is that the controller 220 and the power determination unit 210 are connected by wire to each other in any case. That is, the controller 220 can accurately grasp the power being outputted from the beamforming processor 110, and through this, the controller 220 can improve the accuracy of the determination of whether the beamforming processor is normal.

Meanwhile, the power determination unit 210 according to the disclosure may further include a phase compensation unit configured to compensate for a phase difference between a plurality of output ports deployed on the beamforming processor 110 and an antenna connected to correspond to the plurality of output ports. The detailed explanation thereof will be made through FIGS. 3A and 3B.

Figure 3A:
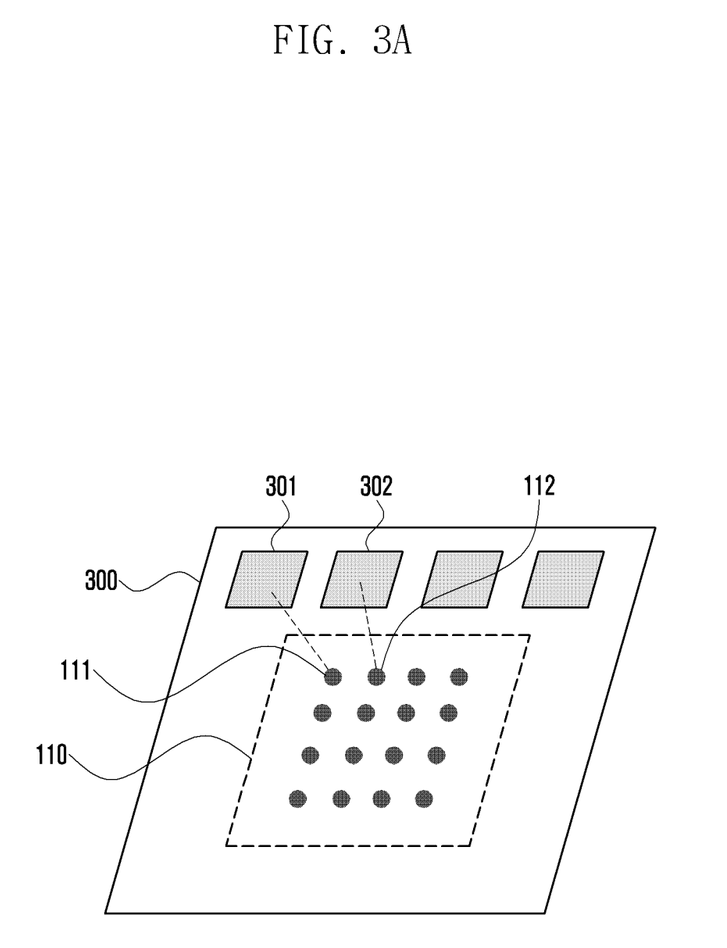
FIG. 3A is a diagram illustrating a beamforming processor and an antenna combined with the beamforming processor according to an embodiment of the disclosure.

FIG. 3A is a diagram illustrating a beamforming processor and an antenna combined with the beamforming processor according to an embodiment of the disclosure.

As described above, the beamforming processor 110 may be finally combined with an antenna 300 including a plurality of antenna elements 301, 302, and so forth. More specifically, as illustrated in FIG. 3A, output ports 111, 112, and so forth of the beamforming processor 110 may be respectively combined with the corresponding antenna elements 301, 302, and so on.

For example, the beamforming processor 110 may include 16 output ports, and corresponding to this, the antenna 300 may include 16 antenna elements. Further, according to an embodiment of FIG. 3A, the first output port 111 may be combined with the first antenna element 301, and the second output port 112 may be combined with the second antenna element 302.

In this case, as illustrated in FIG. 3A, because the sizes of the beamforming processor 110 and the antenna 300 are always unable to coincide with each other, there is no choice but to produce a path difference in a combination between the respective output ports and the antenna elements.

As being previously exemplified, a path in which the first output port 111 and the first antenna element 301 are combined with each other is larger than a path in which the second output port 112 and the second antenna element 302 are combined with each other.

That is, even if an equal input power is inputted to the first output port 111 and the second output port 112, a phase difference may occur in the output power being outputted through the first antenna element 301 and the second antenna element 302 due to the path difference, and through this, the sum of the output powers of the respective antenna elements may not coincide with the output power of the antenna 300.

Accordingly, the disclosure proposes a method for including the phase compensation unit in a power combiner as a method for compensating for the path difference. The detailed explanation thereof will be made later through FIG. 3B.

On the other hand, although FIG. 3A illustrates a case where the beamforming processor includes 16 output ports and the antenna includes 16 antenna elements, the scope of the disclosure should not be limited thereto, and the number of output ports and antenna elements may be changed in accordance with designer's requirements.

Figure 3B:
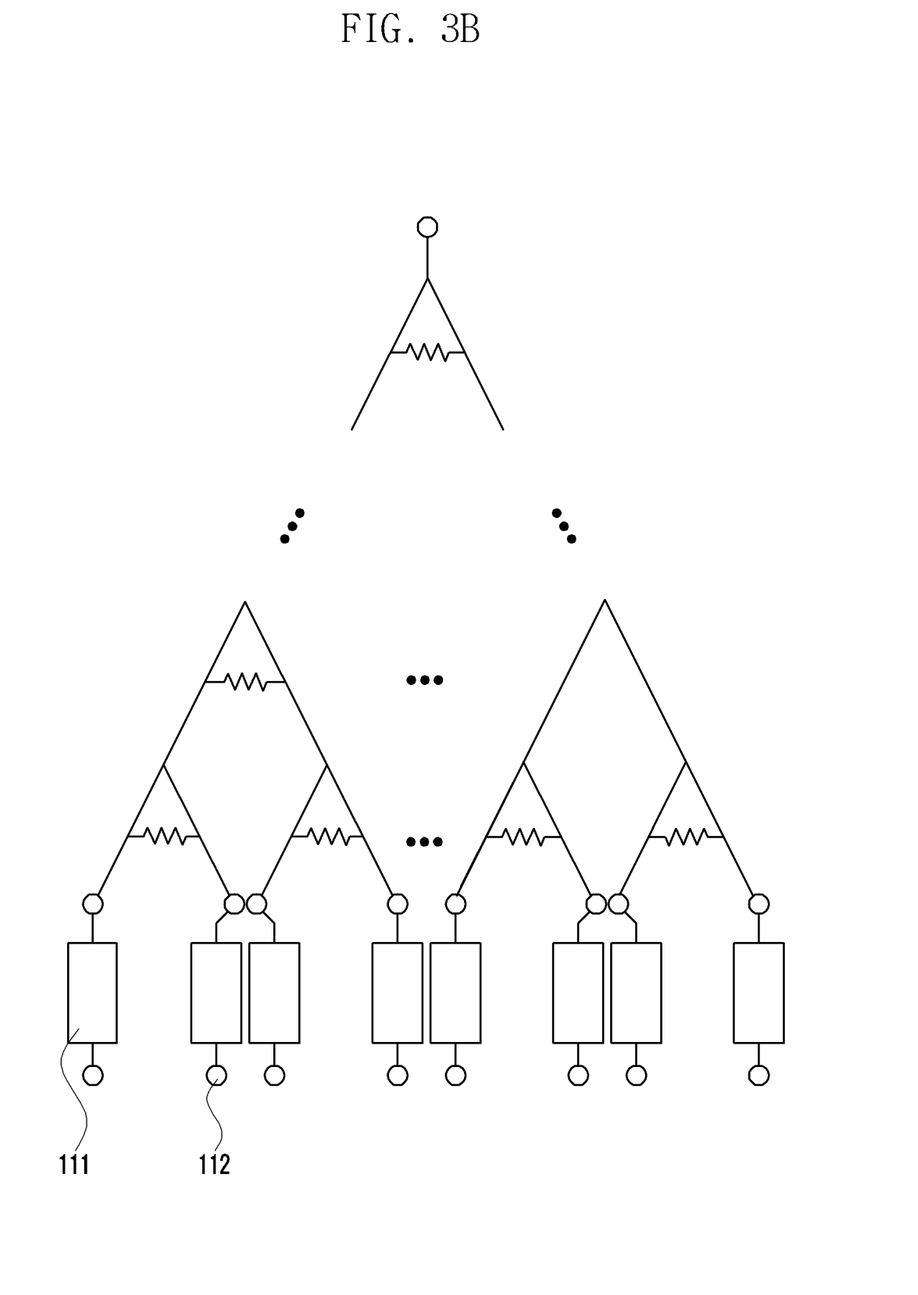
FIG. 3B is a diagram illustrating a phase compensation unit according to an embodiment of the disclosure.

FIG. 3B is a diagram illustrating a phase compensation unit according to an embodiment of the disclosure.

As described above, the path difference may exist in the connections between the respective output ports constituting the beamforming processor and the respective antenna elements constituting the antenna. Accordingly, according to the disclosure, the path difference can be compensated for through the phase compensation unit as illustrated in FIG. 3B.

For example, as illustrated in FIG. 3B, the first output port 111 of the beamforming processor may be electrically connected to a terminal corresponding to the first output port, and the second output port 112 of the beamforming processor may be electrically connected to a terminal corresponding to the second output port.

That is, at least one terminal may be deployed on the phase compensation unit so as to be electrically connected to the respective output ports constituting the beamforming processor. As being previously exemplified, if 16 output ports exist in the beamforming processor, 16 terminals may be deployed in the phase compensation unit.

A circuit for compensating for the path difference between the respective output ports and the respective antenna elements may be configured in a box at the terminal of each phase compensation unit. For example, if power consumption occurring due to the path difference between the first output port and the first antenna element is 2 W and power consumption occurring due to the path difference between the second output port and the second antenna element is 3 W, the circuit capable of compensating for the power consumption may be configured in the box.

Meanwhile, according to the disclosure, the path difference between the output port and the antenna element can be compensated for through not only the phase compensation unit but also a phase shifter separately provided in the beamforming processor that is electrically connected to the power determination unit as a target of the test.

More specifically, the phase shifter may be built in the beamforming processor to correspond to each output port of the beamforming processor. The detailed explanation thereof will be made later with reference to FIGS. 4A and 4B.

Figure 4A:
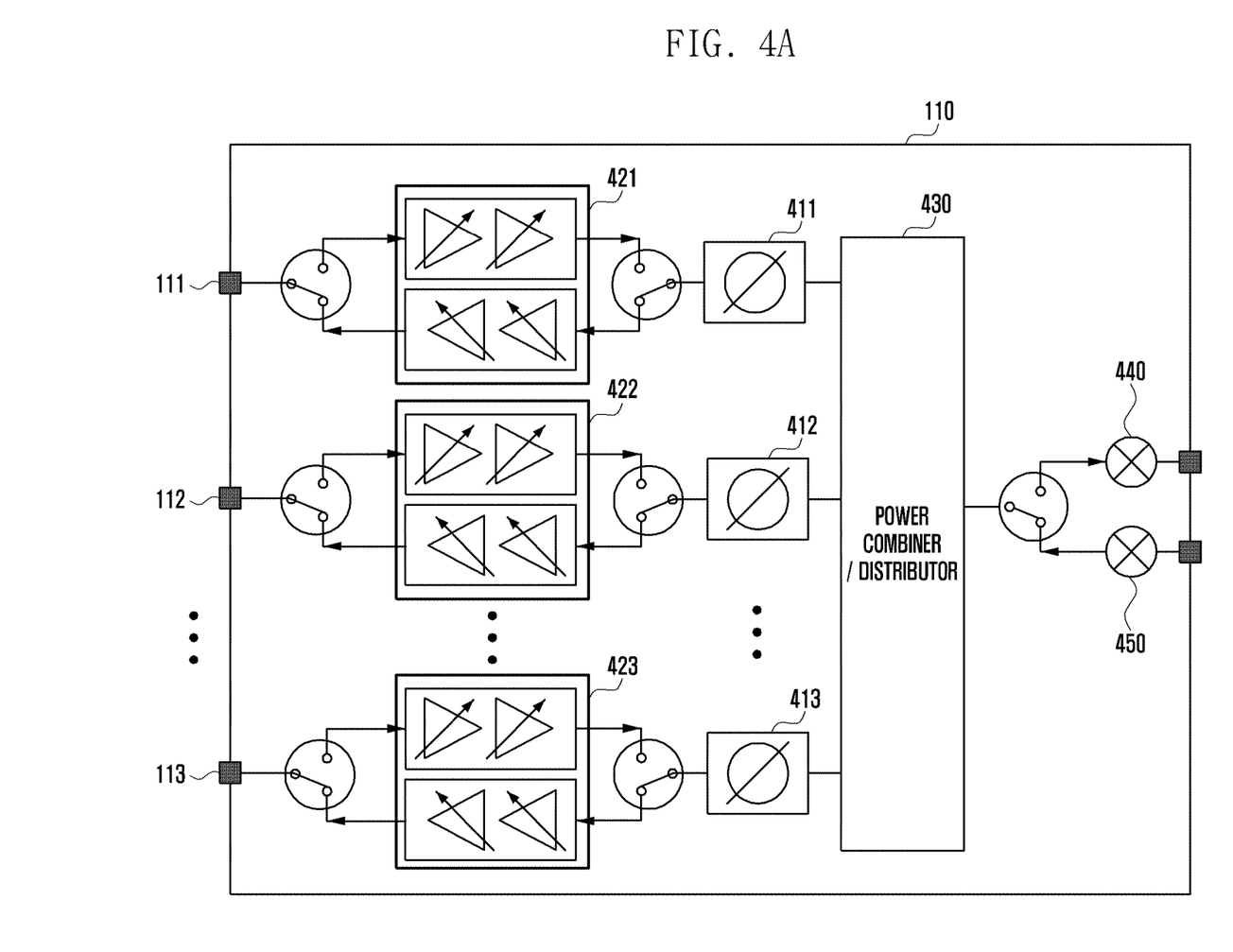
FIG. 4A is a diagram illustrating a first configuration of a phase shifter according to an embodiment of the disclosure.
Figure 4B:
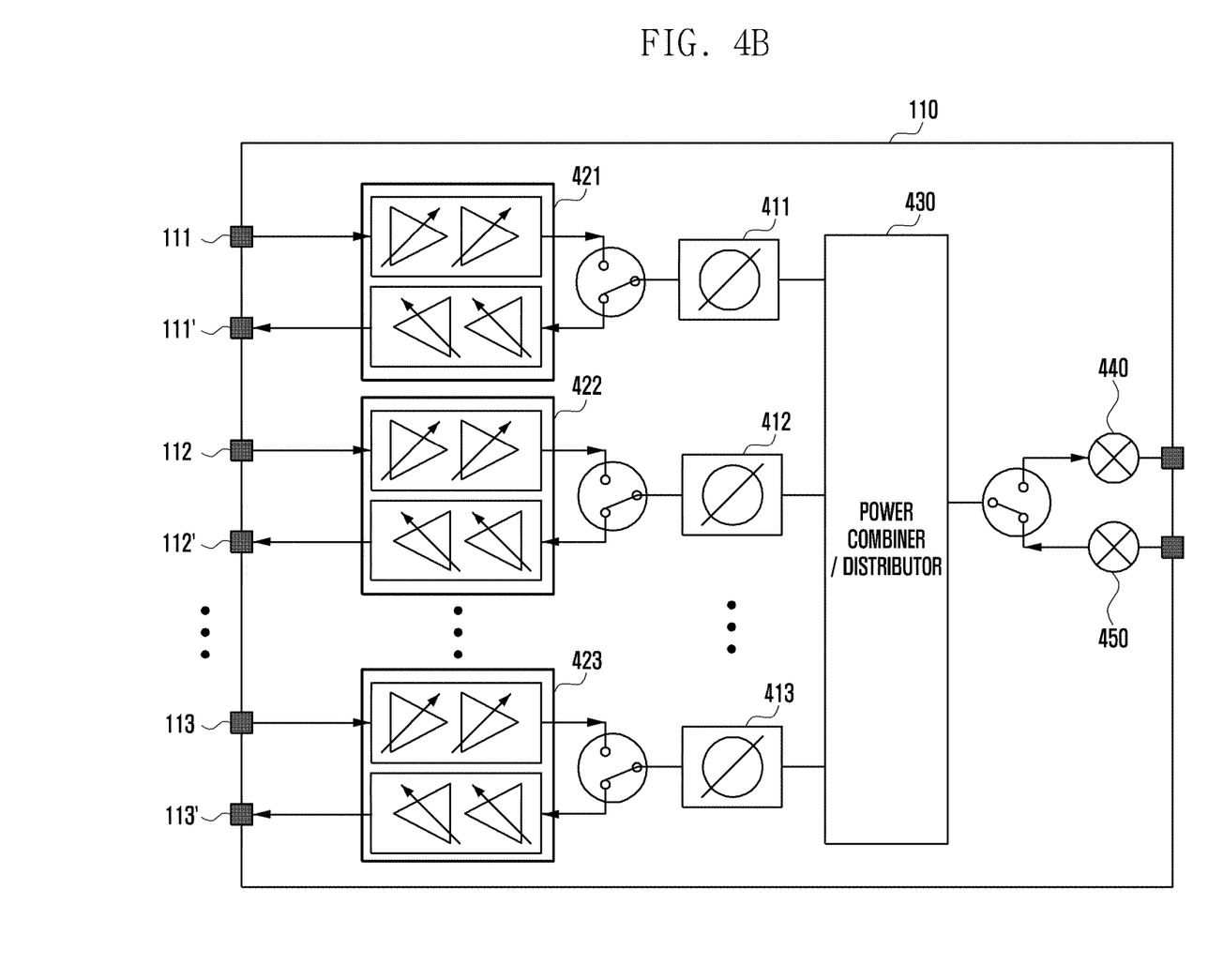
FIG. 4B is a diagram illustrating a second configuration of a phase shifter according to an embodiment of the disclosure.

FIG. 4A is a diagram illustrating a first configuration of a phase shifter according to an embodiment of the disclosure, and FIG. 4B is a diagram illustrating a second configuration of a phase shifter according to an embodiment of the disclosure.

More specifically, FIG. 4A illustrates a case where input ports and output ports can be commonly used in the beamforming processor, and FIG. 4B illustrates a case where input ports and output ports are separately deployed on the beamforming processor.

According to FIG. 4A, one beamforming processor 110 may include at least one input/output port (according to FIG. 4A, because one port can operate as both an input port and an output port through a switching operation, it may be called an input/output port).

Respective input/output ports 111, 112, and 113 may be connected to amplifiers 421, 422, and 423 for amplifying signals inputted/outputted through the input/output port that can be discriminated as an input port or an output port, and the respective amplifiers 421, 422, and 423 may be connected to phase shifters 411, 412, and 413 for shifting phases, respectively.

The phases of the input/output signals may be readjusted through the respective phase shifters 411, 412, and 413, and powers of respective input/output ports may be combined with each other by a power combiner (or power distributor) 430. The frequency of the combined power may be readjusted again through a down mixer 440 or an up mixer 450.

As described above, because the phase shifters 411, 412, and 413 are built in the beamforming processor, their sizes may be limited. That is, the phase control level may be restricted. For example, in the case of 4-bit control, a control at an interval of 360/16=22.5° may be possible, and in the case of 5-bit control, a phase control at an interval of 360/32=11.25° may be possible.

In accordance with the above-described limitations, it may be preferable to perform wide-range path difference compensation (e.g., coarse tuning) through the phase shifters 411, 412, and 413 and to perform small-range path difference compensation (e.g., fine tuning) through the above-described phase compensation unit.

FIG. 4B illustrates a case where input ports 111, 112, and 113 and output ports 111', 112', and 113' are separately deployed in the beamforming processor as described above. The beamforming processor of FIG. 4B has the same configuration as the beamforming processor of FIG. 4A except for the point that the input ports and the output ports can be separately deployed. Accordingly, explanation with reference to FIG. 4B is replaced by the explanation with reference to FIG. 4A.

However, if the input ports and the output ports are separately deployed, power combiners may be connected to the respective input and output ports. In this case, the test of the beamforming processor may be performed through division of the test into an input power test and an output power test, and thus adjustments of phase values of the phase shifters 411, 412, and 413 may differ depending on the input power test and the output power test.

On the other hand, although FIGS. 4A and 4B illustrate the configurations of the beamforming processor including the phase shifters according to an embodiment of the disclosure, the scope of the disclosure should not be limited thereto. That is, the configuration of the beamforming processor may be partially added or deleted within a range in which a technician of an ordinary skill can change the design.

Figure 5:
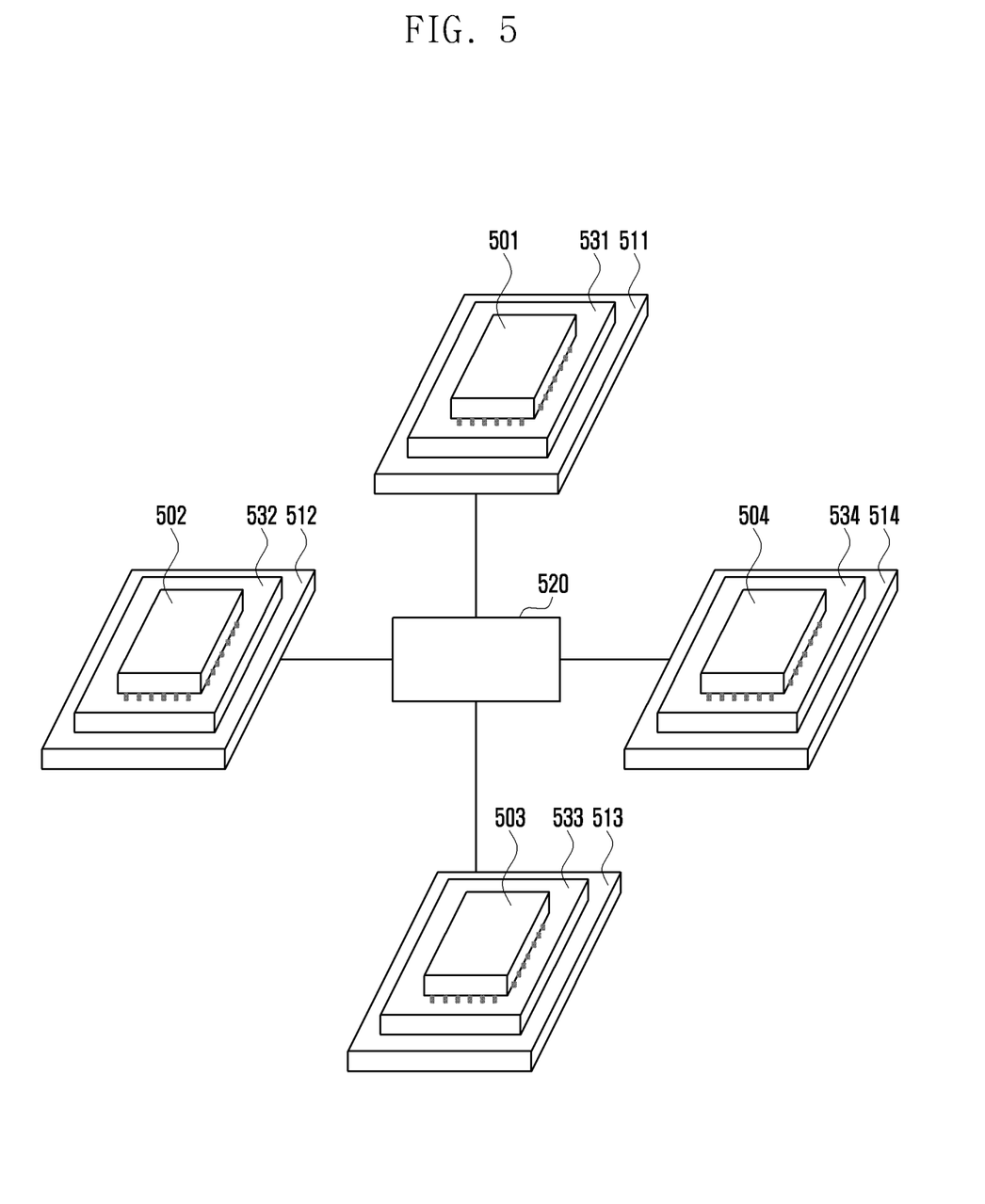
FIG. 5 is a diagram illustrating a case where four power determination units are deployed in a device for testing a beamforming processor according to an embodiment of the disclosure.

FIG. 5 is a diagram illustrating a case where four power determination units are deployed in a device for testing a beamforming processor according to an embodiment of the disclosure.

According to the disclosure, a plurality of power determination units may be connected by wire to one controller. In contrast with the test device as illustrated in FIG. 1, according to a test device as illustrated in FIG. 2 or FIG. 5 according to an embodiment of the disclosure, the respective power determination units may be deployed adjacent to each other (with reference to FIG. 1, because the test is wirelessly performed and thus a shield device for shielding radio waves is essentially required, the test device has a large volume, and thus it is unable to deploy the respective power determination units adjacent to each other).

According to the disclosure, as illustrated in FIG. 5, it is possible to test performances of a plurality of beamforming processors at a time through deployment of the beamforming processors with respect to the plurality of power determination units (i.e., according to the disclosure, time and costs required for the test of the beamforming processors can be greatly reduced).

However, because the controller and the power determination units are connected by wire to each other, it may be preferable to equally maintain the lengths of wires so that a test error due to the path difference of the wires does not occur.

More specifically, according to an embodiment of the disclosure as illustrated in FIG. 5, one controller 520 may be connected to four power determination units 511, 512, 513, and 514. Further, the respective power determination units 511, 512, 513, and 514 may further include seat units 531, 532, 533, and 534 for making beamforming processors 501, 502, 503, and 504 be seated thereon. In this case, in order to improve accuracy of the test device, the wires connected between the controller 520 and the respective power determination units 511, 512, 513, and 514 may have the same length.

On the other hand, as described above with reference to FIGS. 4A and 4B, if the controller 520 includes phase shifters capable of compensating for the respective path differences, the wires connected between the controller 520 and the respective power determination units 511, 512, 513, and 514 may have different lengths. This is because the path difference due to the difference between the wire lengths can be compensated for through the phase shifters included in the controller 520.

Figure 6:
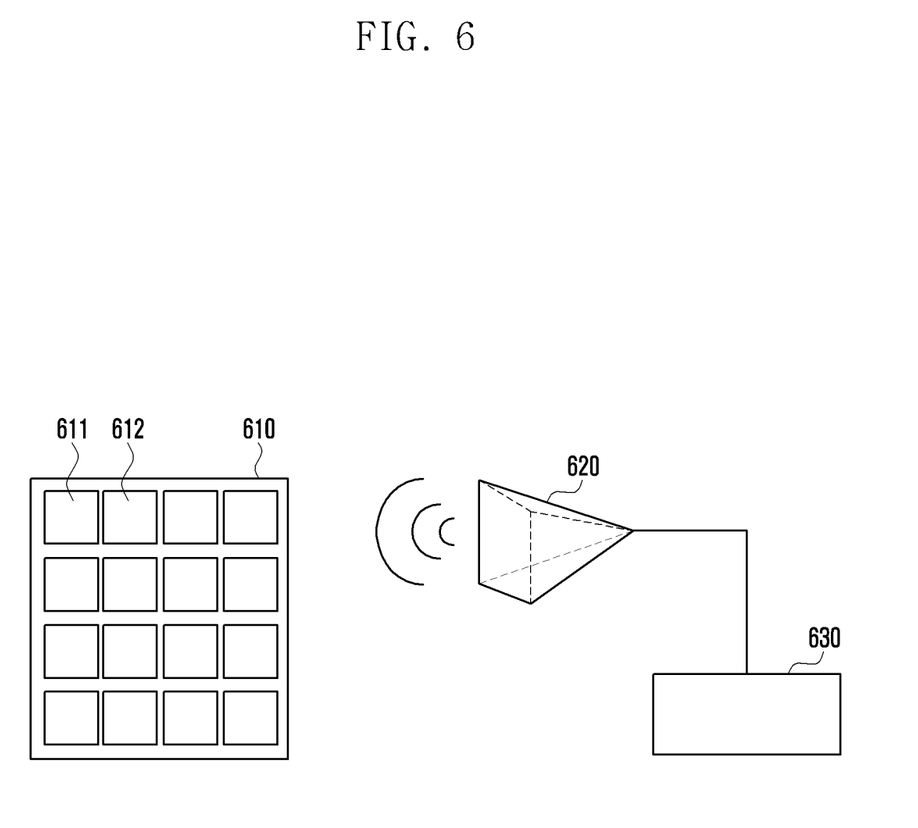
FIG. 6 is a diagram illustrating a case where a beamforming module including a plurality of beamforming processors is wirelessly tested according to an embodiment of disclosure.

FIG. 6 is a diagram illustrating a case where a beamforming module including a plurality of beamforming processors is wirelessly tested according to an embodiment of disclosure.

According to the disclosure, only beamforming processors are tested through removal of antennas combined with the beamforming processors. Accordingly, if the beamforming processors and the antennas are combined with each other, a test for measuring the beamforming performance may be additionally required. Accordingly, FIG. 6 illustrates an additional test device structure for this.

More specifically, respective beamforming processors may be combined with antennas to form one beamforming module 611, 612, or the like. Further, if needed, an electronic device may include at least one beamforming module. For example, FIG. 6 illustrates a case where an electronic device 610 includes 16 beamforming modules 611, 612, and so forth.

According to an embodiment of the disclosure, the electronic device 610 may communicate with a separately provided antenna module 620. More specifically, the antenna module 620 may communicate with the beamforming modules 611, 612, and so forth constituting the electronic device 610.

A controller 630 may be electrically connected to the antenna module 620, and it may determine whether the respective beamforming modules 611, 612, and so forth are normal based on beam information of the respective beamforming modules 611, 612, and so forth being received from the antenna module 620.

For example, it is assumed that if the intensity of the beam received from the beamforming module is equal to or higher than 5 dB, the controller 630 determines that the corresponding beamforming module is normal. If the beam of 3 dB is received from the first beamforming module 611 and the beam of 6 dB is received from the second beamforming module 612, the controller 630 may determine that the first beamforming module 611 is abnormal and the second beamforming module 612 is normal.

Further, although not illustrated, because the test of FIG. 6 is wirelessly performed, a shield device for improving accuracy of the test may be added to the configuration of FIG. 6, and in this case, the shield device may be shaped to surround all the electronic device 610, the antenna module 620, and the controller 630.

On the other hand, although FIG. 6 illustrates only a case where 16 beamforming modules 611, 612, and so forth are deployed in one electronic device 610, the scope of the disclosure should not be limited thereto. That is, if needed, the number of beamforming modules deployed in the electronic device 610 may be increased or decreased.

In addition, the scope of the disclosure may reach up to the range in which a technician of an ordinary skill can easily change the method by the controller 630 for determining whether the electronic device 610 or the beamforming module 611, 612, or the like is normal.

Further, the electronic device 610 may include various devices having built-in antennas to transmit/receive radio waves, such as a smart phone, a tablet PC, and a base station.

Further, the beamforming processor disclosed in the disclosure may be replaced by a processor having a plurality of input/output ports, and thus the processor having the plurality of input/output ports may perform the test for determining whether the processor performs a normal operation in the same method as the above-described method.

Embodiments of the disclosure that are described in the specification and drawings are merely for easy explanation of the technical contents of the disclosure and proposal of specific examples to help understanding of the disclosure, but are not intended to limit the scope of the disclosure. That is, it will be apparent to those of ordinary skill in the art to which the disclosure pertains that other modified examples based on the technical idea of the disclosure can be embodied. Further, if needed, the respective embodiments may be operated in combination. For example, parts of embodiment 1, embodiment 2, and embodiment 3 of the disclosure may be combined with each other to operate a base station and a terminal. Further, other modified examples that are based on the technical idea of the embodiments can be embodied even in other systems, such as 5G and NR systems.

The invention claimed is:

1. A device for testing a beamforming processor comprising plural output ports, the device comprising:
at least one power determination unit electrically connectable to the beamforming processor and configured to determine an output power of the plural output ports of the beamforming processor; and
a controller connected by at least one wire to the at least one power determination unit and configured to:
identify whether the output power received through the at least one wire from the at least one power determination unit is within a predetermined range, and
determine that the beamforming processor is normal, in case that the output power is within the predetermined range,
wherein the beamforming processor is connectable to an antenna comprising plural antenna elements for performing a beamforming.

2. The device of claim 1, wherein each of the at least one power determination unit comprises a phase compensation unit configured to compensate for a difference in connection paths between each of the plural output ports of the beamforming processor and each of the plural antenna elements of the antenna.

3. The device of claim 1, wherein the controller is configured to:
supply an input power to the at least one power determination unit, and
determine whether the beamforming processor is normal, based on the input power supplied to the at least one power determination unit and the output power received through the at least one wire from the at least one power determination unit.

4. The device of claim 1, wherein the beamforming processor is determined to be abnormal in case that the output power is not within the predetermined range.

5. The device of claim 1, wherein each of the at least one power determination unit further comprises a seat unit configured to electrically connect the beamforming processor to each of the at least one power determination unit.

6. The device of claim 1,
wherein the beamforming processor comprises plural phase shifters corresponding to the plural output ports of the beamforming processor, and
wherein the plural phase shifters are configured to compensate for a difference in connection paths between each of the plural output ports of the beamforming processor and each of the antenna elements of the antenna.

7. The device of claim 1, wherein the controller is connected to the at least one power determination unit by the at least one wire having a same length.

8. A method for testing a beamforming module configured by connecting a beamforming processor comprising plural output ports and an antenna comprising plural antenna elements for performing a beamforming, the method comprising:
- determining, by at least one power determination unit electrically connectable to the beamforming processor, an output power of the plural output ports of the beamforming processor;
- identifying, by a first controller connected by at least one wire to the at least one power determination unit, whether the output power received through the at least one wire from the at least one power determination unit is within a predetermined range; and
- determining, by the first controller that the beamforming processor is normal, in case that the output power is within the predetermined range.

9. The method of claim 8, wherein each of the at least one power determination unit comprises a phase compensation unit configured to compensate for a difference in connection paths between each of the plural output ports of the beamforming processor and each of the plural antenna elements of the antenna.

10. The method of claim 8, further comprising:
- supplying, by the first controller, an input power to the at least one power determination unit; and
- determining, by the first controller, whether the beamforming processor is normal, based on the input power supplied to the at least one power determination unit and the output power received through the at least one wire from the at least one power determination unit.

11. The method of claim 8, wherein the beamforming processor is determined to be abnormal, in case that the output power is not within the predetermined range.

12. The method of claim 8, wherein each of the at least one power determination unit comprises a seat unit configured to electrically connect the beamforming processor to each of the at least one power determination unit.

13. The method of claim 8,
- wherein the beamforming processor comprises plural phase shifters corresponding to the plural output ports of the beamforming processor, and
- wherein the plural phase shifters are configured to compensate for a difference in connection paths between each of the plural output ports of the beamforming processor and each of the antenna elements of the antenna.

14. The method of claim 8, wherein the first controller is connected to the at least one power determination unit by the at least one wire having a same length.

15. The method of claim 8, further comprising:
- performing, by the beamforming module configured by connecting the beamforming processor and the antenna, a wireless communication with an antenna module for testing the beamforming module;
- identifying, by a second controller electrically connected to the antenna module for testing the beamforming module, an intensity of a beam received from the beamforming module based on the performed wireless communication; and
- determining, by the second controller, whether the beamforming module is normal, based on a result of the identification of the intensity of the beam.

* * * * *